(12) United States Patent
Takai

(10) Patent No.: US 7,694,201 B2
(45) Date of Patent: Apr. 6, 2010

(54) SEMICONDUCTOR TESTING DEVICE HAVING TEST RESULT SENDING BACK TO GENERATE SECOND DATA

(75) Inventor: Hideyoshi Takai, Ota-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 383 days.

(21) Appl. No.: 11/858,374

(22) Filed: Sep. 20, 2007

(65) Prior Publication Data

US 2008/0077349 A1    Mar. 27, 2008

(30) Foreign Application Priority Data

Sep. 20, 2006    (JP) .............. 2006-254937

(51) Int. Cl.
*G01R 31/28* (2006.01)
*G11C 29/00* (2006.01)
*G06F 11/00* (2006.01)

(52) U.S. Cl. .............. 714/734; 714/718; 714/738; 714/31; 714/54

(58) Field of Classification Search .............. None
See application file for complete search history.

(56) References Cited

U.S. PATENT DOCUMENTS

| | | | |
|---|---|---|---|
| 6,477,672 B1 | 11/2002 | Satoh | |
| 6,504,773 B2 | 1/2003 | Kobayashi | |
| 6,634,004 B1 | 10/2003 | Yamada et al. | |
| 6,885,956 B2 | 4/2005 | Baba | |
| 7,028,236 B2 * | 4/2006 | Okazaki | .............. 714/718 |
| 7,353,437 B2 * | 4/2008 | Crump et al. | .............. 714/718 |
| 7,559,000 B2 * | 7/2009 | Sato | .............. 714/738 |

FOREIGN PATENT DOCUMENTS

JP    2000-100196    4/2000

* cited by examiner

*Primary Examiner*—Christine T Tu
(74) *Attorney, Agent, or Firm*—Oblon, Spivak, McClelland, Maier & Neustadt, L.L.P.

(57) ABSTRACT

A semiconductor testing device includes: a data memory which stores a test program, said test program generating a test command for testing a plurality of functions within one function area of a plurality of function areas of a semiconductor device, said test command being generated for said function area; a first area generation part which generates first data, said first data identifying one function area of said plurality of function areas, said plurality of functions of said one function area being tested; a main control part which generates said test command based on said test program and said first data and transmits said test command to said semiconductor device; a second area generation part which receives a first result, said first result being returned from said semiconductor device based on a first test in accordance with said test command and generates a second result based on said first result, said second result showing a pass or failure of said first test corresponding to said function area; and a third area generation part which generates second data based on said second result and transmits said second data to said first area generation part, said first area generation part generating third data based on said second data, said third data identifying one or more of said plurality of function areas, said one or more of said plurality of function areas being the object of a second test subsequent to said first test.

20 Claims, 6 Drawing Sheets

SEMICONDUCTOR TESTING DEVICE HAVING TEST RESULT SENDING BACK TO GENERATE SECOND DATA

CROSS REFERENCE TO RELATED APPLICATION

This application is based upon and claims the benefit of priority from the prior Japanese Patent Application No. 2006-254937, filed on Sep. 20, 2006; the entire contents of which are incorporated herein by reference.

BACKGROUND OF THE INVENTION

1. Field of the Invention

This invention relates to a semiconductor testing device used in testing a semiconductor device.

2. Description of the Related Art

At the stage of shipping a semiconductor device (for example, a semiconductor memory device) a test for evaluating the characteristic of semiconductor device is performed (a characteristic evaluation test). In a conventional characteristic evaluation test, a testing method in which the same operation is repeated many times in all the areas of an a semiconductor memory device is adopted. That is, a test parameter value is changed in order, said test parameter value being specified by a test program which operates in the semiconductor testing device for a semiconductor memory which is to be tested (hereinafter written as "MUT", which is an abbreviation of Memory Under Test). For example, when a read-out voltage is applied to all the areas, a test is repeated while stepping up little by little this applied voltage and the characteristics of the memory cells which comprise a semiconductor memory device are tested.

However, with the increase in capacity of a semiconductor device, the percentage of the whole test which is taken up by the characteristics evaluation test is increasing and the number of times itself which the same operation is performed while changing the conditions is also increasing dramatically. As a result, the required time for a test becomes larger and larger. Consequently, as is shown in U.S. Pat. No. 6,477,672-B1, an attempt to arrange a new memory within a semiconductor testing device which has a storage capacity corresponding to the number of memory blocks which an MUT has. However, by this method, the number of memory cell blocks in each MUT is different, there is a need to set a memory for each MUT and thus is not efficient.

BRIEF SUMMARY OF THE INVENTION

A semiconductor testing device according to one embodiment of the present invention comprises a data memory which stores a test program, said test program generating one or more of test commands, each of said one or more of test commands instructing a test of a plurality of functions, said plurality of functions being included in one function area of a plurality of function areas of a semiconductor device; a first area generation part which generates first data, said first data identifying one or more of function areas of said plurality of function areas; a main control part which generates said one or more of test commands based on said test program and said first data and transmits said one or more of test commands to said semiconductor device; a second area generation part which receives a first result, said first result being returned from said semiconductor device based on one or more of first tests, each of said one or more of first tests having been instructed by each of said one or more of test commands, said second area generation part generating one or more of second results based on said first result, each of said one or more of second results showing a pass or failure of each of said one or more of first tests; and a third area generation part which transmits said one or more of second results to said first area generation part, said first area generation part generating second data based on said second result, said second data identifying one or more of said plurality of function areas, a plurality of functions of each of said one or more of said plurality of function areas being the object of second tests subsequent to said first tests.

A method for testing a semiconductor device according to one embodiment of the present invention comprises storing a test program, said test program generating one or more of test commands, each of said one or more of test commands instructing a test of a plurality of functions, said plurality of functions being included in one function area of a plurality of function areas of a semiconductor device; generating first data, said first data identifying one or more of function areas of said plurality of function areas; generating said one or more of test commands based on said test program and said first data and transmits said one or more of test commands to said semiconductor device; receiving a first result, said first result being returned from said semiconductor device based on one or more of first tests, each of said one or more of first tests having been instructed by each of said one or more of test commands; generating one or more of second results based on said first result, each of said one or more of second results showing a pass or failure of each of said one or more of first tests; and generating second data based on said second result, said second data identifying one or more of said plurality of function areas, a plurality of functions of each of said one or more of said plurality of function areas being the object of second tests subsequent to said first tests.

A computer program product in one embodiment of the present invention having a set of executable instruction codes stored on a computer readable medium for controlling a semiconductor testing device, comprises storing a test program, said test program generating one or more of test commands, each of said one or more of test commands instructing a test of a plurality of functions, said plurality of functions being included in one function area of a plurality of function areas of a semiconductor device; generating first data, said first data identifying one or more of function areas of said plurality of function areas; generating said one or more of test commands based on said test program and said first data and transmits said one or more of test commands to said semiconductor device; receiving a first result, said first result being returned from said semiconductor device based on one or more of first tests, each of said one or more of first tests having been instructed by each of said one or more of test commands; generating one or more of second results based on said first result, each of said one or more of second results showing a pass or failure of each of said one or more of first tests; and generating second data based on said second result, said second data identifying one or more of said plurality of function areas, a plurality of functions of each of said one or more of said plurality of function areas being the object of second tests subsequent to said first tests.

DETAILED DESCRIPTION OF THE INVENTION

Figure 1:
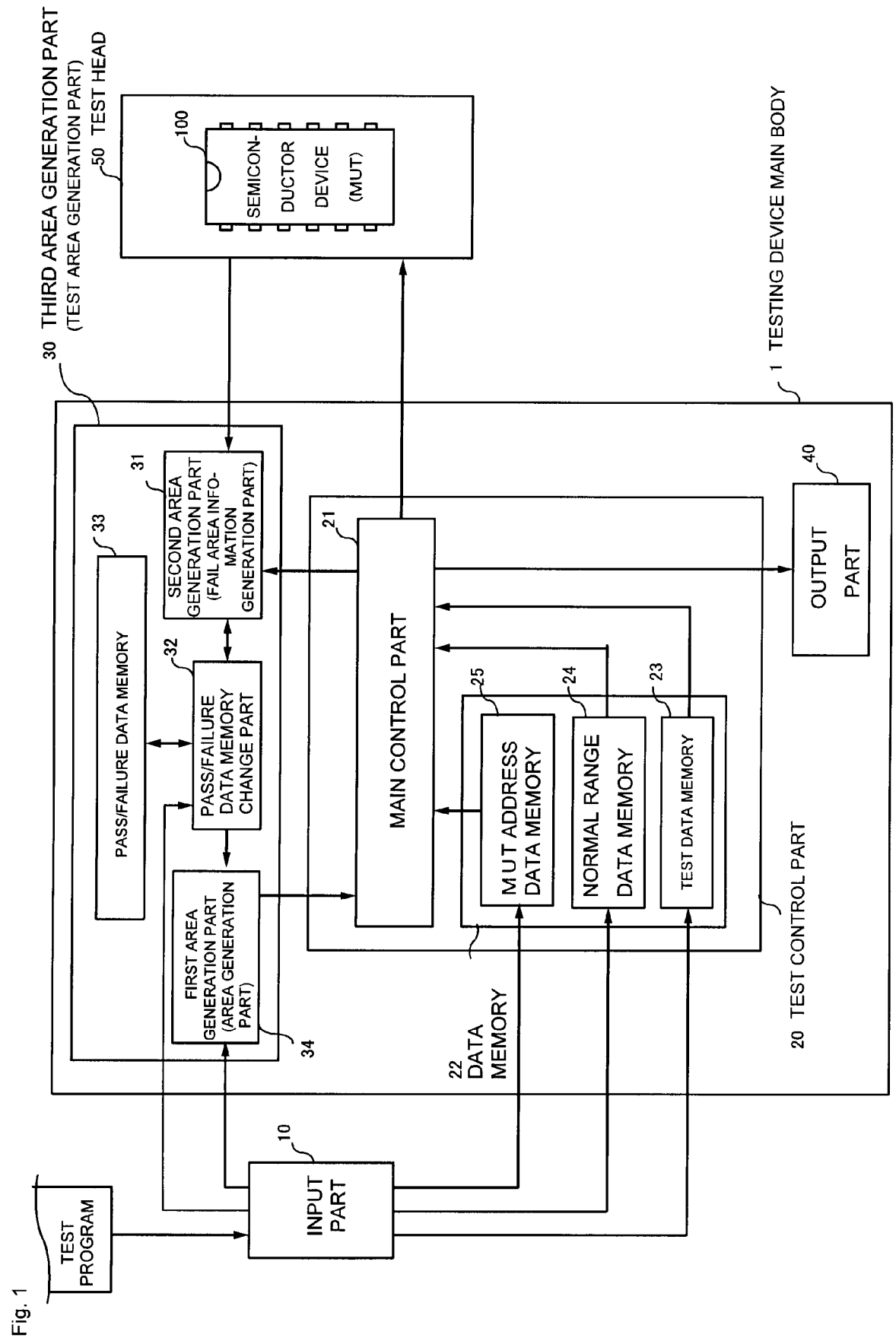
FIG. 1 shows an outline construction of a semiconductor testing device related to one embodiment of the present invention.

Below, a semiconductor testing device relating to one embodiment of the present invention is explained in detail while referring to the drawings. Furthermore, in the present embodiment, as is shown in an example of a semiconductor testing device relating to one embodiment of this invention, the semiconductor testing device relating to one embodiment of this invention is not limited to what is explained in these embodiments.

At the time of shipment of a semiconductor device, the conformity of the design specifications of this semiconductor device is confirmed. In order to achieve this, various tests are performed from a variety of aspects. Only products which have passed these tests are shipped. And, a considerable part of these tests are taken up by tests called characteristics evaluation tests.

A semiconductor device is produced through a complex and nano-meter-size manufacturing process. Consequently, variations in the manufacturing process may easily occur. Therefore, it is difficult to make all final products conform exactly the same characteristics. In this light, the following approach is adopted for a semiconductor memory device as one example of a semiconductor device. If all the memory cells of one semiconductor device show characteristics within a predetermined range, that semiconductor device is deemed to be a passed product. A characteristic evaluation test is performed in order to verify whether all the memory cells of a semiconductor memory device possess a characteristic within a predetermined range.

More specifically, in a characteristic evaluation test related to a semiconductor memory device, all the memory cells of a semiconductor memory device, that is, an MUT, are tested. Then, a test is performed which judges whether all the memory cells have a characteristic within this predetermined range across the entire MUT. Therefore, a test as explained below is performed in order to verify the characteristic of the memory cell stated above. Under specific conditions, while designating memory cell blocks one by one a test is repeated on all the memory cells which belong to that block while changing little by little the test conditions. Then, referring to the distribution of these test results it is judged whether the results fall within the predetermined range.

However, with an increase in capacity and miniaturization of semiconductor devices the number of the conditions, blocks, etc. under which the tests are to be conducted is dramatically increasing. As a result, a great amount of time and work is needed for product testing and becomes an obstacle to reducing the costs of manufacturing a semiconductor device.

Therefore, if this type of characteristic evaluation tests can be made more efficient and if testing time can be reduced, it is possible to realize a reduction in the manufacturing costs of a semiconductor device. The semiconductor testing device relating to the present invention aims to reduce this test time. The more the conditions needed for testing increase or the more the capacity of a semiconductor device increases or, in other words, the more the number of memory cells increase, the more notable are the effects of the present invention.

Figure 5:
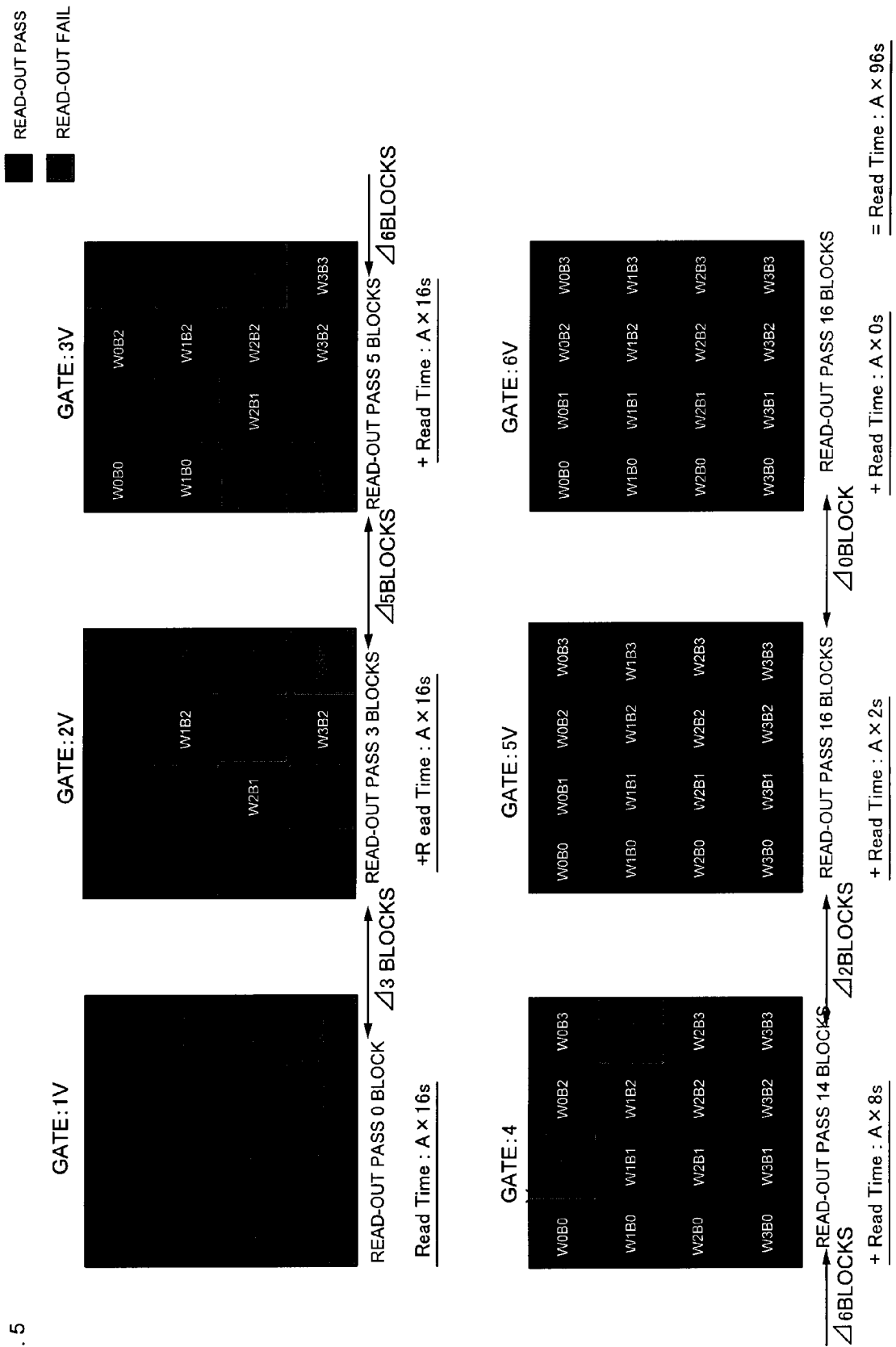
FIG. 5 explains a measurement test of the amount of electrons conducted by a semiconductor testing device.

Here, a memory cell characteristic evaluation test is explained as one example of a semiconductor testing device. More specifically, a test which measures the amount of electrons in a floating gate in each memory cell is explained while referring to the drawings. FIG. 5 is a typical drawing of a measurement test process of the amount of electrons conducted by a semiconductor testing device. In order to succinctly explain the testing method, the memory cells of MUT100 are shown in block units and the memory space of the memory cells of MUT100 is typically represented as a series of 4 vertical×4 horizontal. Alternatively, a memory cell block is represented from W0B0 to W3B3 for descriptive purposes. Actually, because each memory cell block is comprised of a plurality of memory cells, one memory block is comprised by memory cells designated from, for example, word line 0 to word line m and from bit line 0 to bit line n.

An outline of the characteristic evaluation test of memory cells is explained while referring to FIG. 5. In this test, the amount of electrons in the floating gate of each memory cell of MUT100 is measured and it is judged whether the memory cells of a fixed ratio or more have an amount of electrons within a predetermined range and it is decided whether it has passed the test. Specifically, a predetermined voltage is applied to each floating gate and all of the memory cells of all of the memory cell blocks are programmed with certain data. Following this, read-out of the value programmed in all the memory cells in all the memory cell blocks is repeatedly executed. This test is performed in the order of W0B0, W0B1, W0B2, etc. When W0B3 is reached, the W direction is changed and the test is performed on the W1 row in a B direction from 0 to 3 (that is, from W1B0 to W1B3). This operation is repeated until the final memory block W3B3 is reached. A series of tests is performed by verifying one value of the test parameter from the memory cell block W0B0 to W3B3. The results of a test conducted by the series of test commands are stored either as "read-out pass" for each of memory cells from which all read-out have succeeded or as "read-out fail" for each of memory cells from which a red-out has not succeeded. For example, in the case where a memory cell can not be read-out within a predetermined period of time or a value different to the value that has been programmed is read-out, the result becomes "read-out fail."

The results of a test conducted by a series of test commands are stored within the semiconductor testing device in memory-cell-block-units as stated above. That is, the test results are stored by programming them to addresses of a memory of the semiconductor testing device corresponding to each appropriate memory cell block of an MUT. In FIG. 5, the memory cell blocks represented in black are "read-out pass" memory cell blocks and the memory cell blocks represented by a dark grey are "read-out fail" memory cell blocks of an MUT. While FIG. 5 only represents memory cell blocks as conceptual graphic symbols, actually, the test results of memory cells are stored as data in memories of the semiconductor testing device.

Figure 6:
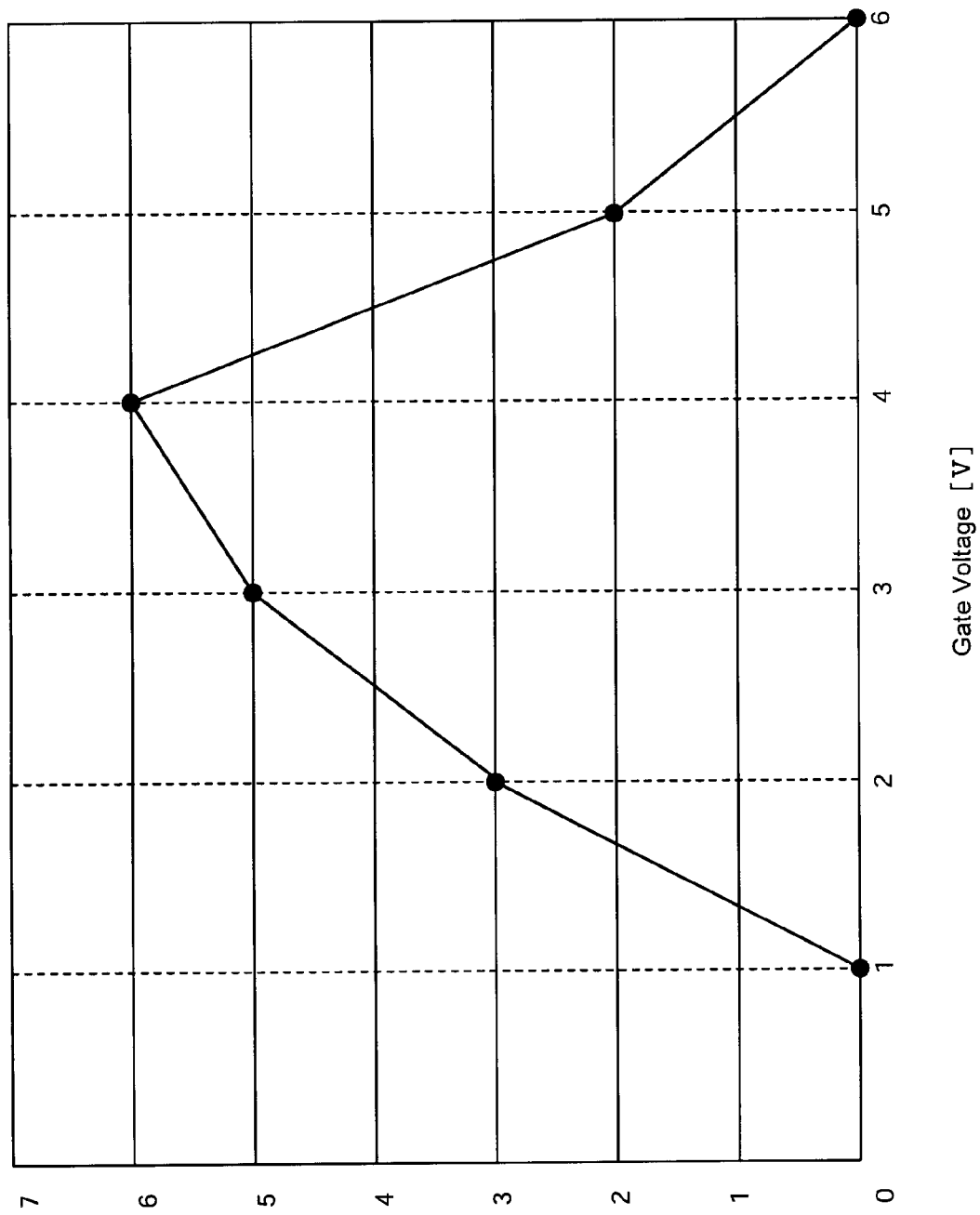
FIG. 6 shows a distribution of the result of a measurement test of the amount of electrons in a floating gate conducted by a semiconductor testing device related to one embodiment of the present invention shown in FIG. 5.

In addition, each test result which is obtained by each test command of one test parameter value is stored within the semiconductor testing device as data which shows a distribution such as shown in FIG. 6. FIG. 6 is a drawing of the distribution of measurement results shown in FIG. 5 of the amount of electrons in each floating gate of the MUT. In FIG. 6, the horizontal axis corresponds to the voltage (V) which is applied to floating gates and the vertical axis corresponds to the number of memory cell blocks which are detected as "read-out pass" among sixteen memory cell blocks. However, this number of memory cell blocks expresses the difference in the number of memory cells blocks which are detected as "read-out pass" at the time of the preceding application of a voltage and the number of memory cell blocks which are detected as "read-out pass" at the time of the current application of a voltage. That is, the vertical axis represents the number of memory cell blocks which are detected at the time of the current application of a voltage as "read-out pass" among the memory cell blocks which were "read-out fail."

In the series of tests, a set of voltages which are decided in advance are applied to all the memory cells in each memory cell block in an order and a set of data-programming are performed. Then a read-out voltage is applied to all these memory cells and it is judged whether the memory cells can be read-out or not. In the series of tests, the order of the parameter values to be used decided based on the purpose of the series of tests. The tests shown in FIG. 5, shows an example whereby the height of the read-out voltage is set as a test parameter and using a test parameter value which is set in 1V steps between 1V and 6V, the tests are repeated and set so that verification is realized. In an actual verification, for example, setting the test parameter value in steps of 0.1V between 0V and 10V, the tests are repeated while changing the test parameter value in sequence. Further, the step of the test parameter value in units of 0.1V is decided for example by calculating a range for a permissible measurement error from a measurement error of 0.02V which has been measured in advance. Depending on the purpose of the verification, different values may be used as a step of the test parameter value.

The MUT is set in the semiconductor testing device and programming is performed in sequence at a threshold of 1V, which is the initial test parameter value, to all the memory cells within all the memory cell blocks. After this, a read-out voltage of 1V is applied and read-out is performed in sequence. Using a read-out voltage (Vread) of 1V which is the test parameter value, in the case where all the memory cells within a certain memory cell block can be read out, that memory cell block is stored as a memory cell block of "read-out pass." A memory cell block in which at least one memory cell within said memory cell block could not be read is stored as "read-out fail." In FIG. 5, at the stage of programming with a threshold of 1V, all the memory cell blocks are represented as "read-out fail" in dark grey because all the memory cell blocks have failed read-outs. Therefore, in the data distribution drawing shown in FIG. 6, at the position of the horizontal axis corresponding to the first value of the gate voltage, which is the parameter value of the first stage of test, is 1V, the number of "read-out pass" memory cell blocks is stored as 0.

When the time length required for programming and read-out is expressed as (A) seconds, the test time length (hereinafter called Read Time) required for programming and read-out is expressed as (A×16) seconds because the same operation is repeated for sixteen memory cell blocks in the case.

Next, programming is performed with a 2V threshold voltage which is the test parameter's second value. After this, a 2V read-out voltage is applied and read-out is performed. The memory cell blocks in which all the memory cells could be read-out within a block at a 2V read-out voltage, are stored as "read-out pass." The memory cell blocks in which at least one memory cell could not be read-out are stored as "read-out fail." Because there are three memory cell blocks in which all the memory cells could be read at a 2V read-out voltage, as shown in FIG. 5, the three memory cell blocks are displayed as "read-out pass" in black. Alternatively, as distribution graphic data in FIG. 6, when a second value of the gate voltage which is a test parameter is 2V on the voltage axis, the number of "read-out pass" memory cell blocks is plotted as 3.

Because the same operation is repeated in sixteen memory cell blocks, the Read Time which is required for this programming and read-out is (A×16) seconds.

Similarly, programming and read-out is performed with 3V which is the test parameter's third value and the subsequent tests are performed while changing the test parameter value to 4V, 5V and 6V. In FIG. 5, five memory cell blocks become "read-out pass" at 3V, six blocks at 4V and two memory cell blocks become "read-out pass" at 5V.

In a test using a conventional method, test data is stored for each test parameter value and the memory cell blocks which have passed a test using each value of the test parameter are accumulated and stored. Therefore, in FIG. 5, in the test where the parameter value is 3V, the accumulated eight memory cell blocks are displayed as "read-out pass" in black. Similarly, in the test where the parameter value is 4V, fourteen memory cell blocks, and in the test where the parameter value is 5V, sixteen memory cell blocks are displayed in black.

In addition, in the test using the conventional method, even in the case where all the memory cell blocks have passed a test, tests with all the test parameter values which are decided in advance are performed. Therefore, in the test where the test parameter value is 5V, even if all the memory cell blocks are stored as "read-out pass," the final test in which the final test parameter value is 6V is performed for all the memory cell blocks. As stated above, because memory cell blocks which have passed a test are accumulated and stored, even if all the memory cell blocks in FIG. 5 are stored in black as "read-out pass" at 5V, a test in which the final parameter value is 6V is performed for all the memory cell blocks. As a result, even if all the memory cell blocks become "read-out pass" at a certain voltage, e.g. 5V, all the memory cell blocks become displayed in black as "read-out pass" at 6V too.

On the other hand, in FIG. 6, because the number of memory cell blocks which have passed a test at each test parameter value is stored, the number of memory cell blocks which became "read-out pass" in a test using 3V as a test parameter value is eight. In addition, because the number of memory cell blocks which became "read-out pass" in a test using 2V as a test parameter value is three, at the coordinate where the test parameter value is 3V, (8−3)=(5) memory cell blocks are plotted. Similarly, in a test which uses 4V as the test parameter value, 6 memory cell blocks are plotted, in a test which uses 5V as the test parameter, 2 memory cell blocks are plotted and in a test which uses 6V as the test parameter, 0 memory cell blocks are plotted. Finally, the line graph which connects all the plotted points is output as data expressed as in FIG. 6.

Let us assume the time length required for the entire test in the case where the time for programming and read-out of one memory cell block is represented as (A) seconds, and that the same process is repeated for all sixteen memory cell blocks at one parameter value. Therefore, because this is repeated for six parameter values, the time required for the entire test is (A×16×6)=(96A).

In FIG. 5, the explanation is done assuming that there sixteen memory cell blocks. In an actual semiconductor device, for example, a 128 MB semiconductor device has 2048 memory cell blocks. Alternatively, in FIG. 5, the case where there are six test parameter values from 1V to 6V is explained, however, the number of test parameter values may reach in the hundreds depending on the test items and the same processes must be repeated for several hundred times in an actual semiconductor device. Because these process are repeated only for the number of memory cell blocks stated above, in the case where the test parameter value is 6V for an MUT of 128 MB, the required time length is (A×2048×6)= (12288×A). In other words, the time length for an actual test is considerably increased.

The items of verification in a characteristic evaluation test are wide ranging and it is not the case that there are only tests measuring an amount of electrons in each memory cell's floating gate. As further tests, there are tests where each takes a certain amount of time such as measuring memory cell access time, measuring erasure time or measuring programming time executed by a timing command etc. In these tests, the test parameter values are subdivided and it is necessary to repeat the same process for all the memory cells and for each parameter value one by one. Therefore, if the time length required for a test process which is repeated and performed on all the memory cells, can be shortened, or if at least one part can be omitted, then it is possible to achieve a substantial reduction in testing time.

Here, a semiconductor testing device relating to one embodiment of the present invention is explained while referring to the drawings. FIG. 1 is an outline construction drawing of a semiconductor testing device relating to one embodiment of the present invention. A semiconductor testing device relating to one embodiment of the present invention is comprised of a testing device main body 1, an input part 10 which inputs a test program and a test head 50 which is loaded with an MUT100.

The testing device main body 1 is comprised of a test control part 20 which controls the execution of each test, an area generation part (or a third area generation part) 30 for generating an area to be tested which generates data which specifies a function area of the MUT100 to be tested when repeating a test, and an output part 40. Further, the testing device main body 1 may comprised of a display part which shows a test result.

The MUT100 is arranged with a plurality of function areas. And, each function area of the plurality of function areas has a plurality of functions. For example, if the MUT100 is a semiconductor memory device, a plurality of function areas corresponds to memory cell blocks and a plurality of functions corresponds to a plurality of memory cells.

Within the test control part 20 there is a main control part 21 and a data memory 22, and the test control part 20 controls the overall test of the MUT100. That is, the test parameter values and memory cells to be tested are decided by units of function areas, for example, by units of memory cell blocks, and the MUT100 is instructed by this test control part 20.

Furthermore, the test control part 20 stores the records of the results of tests which are repeatedly performed, however, a judgment is finally made as to whether or not the MUT100 is defective based on these records and the final test results are output via the output part 40. Also, in the case where there is a display part, the test results are displayed in this display part.

The main control part 21 controls the above stated operations of the test control part 20. This main control part 21 selects a test parameter value based on a test program which is stored in a test data storage part 23 within the data memory 22 via the input part 10, specifies a memory cell block which becomes the object of a test, generates a test instruction via one test parameter value and transmits to the MUT100 as a test command.

In a conventional method, such a test command instructs a test on all the memory cell blocks. As a result, after a test with a first test parameter value is completed, a second test parameter value is selected and a test command for a test execution on the same memory cell is generated. However, in the semiconductor testing device relating to one embodiment of the present invention, in order to shorten testing time length, for example, one or more of test commands are generated which excludes those memory cell blocks which have passed a test of a first test parameter value from becoming the object of a test of a second test parameter value. That is, memory cell blocks which have passed a test of a first test parameter value are excluded from becoming the objects of a test of a second test parameter value, the selection of an area to be tested is performed and one or more of test commands are generated which allows only those memory cell blocks which failed the test with a first test parameter value to become the object of the next test. For example, if programming of a memory cell at a low program voltage is successfully performed, programming of the memory cell at a high program voltage is also successfully performed. So, it is possible to omit the memory cell blocks which have this type of memory cell, which has succeeded a program and read-out test at a low voltage, from a program and read-out test with a higher voltage.

In order to generate this kind of test commands, the address data of a memory cell block which should be tested next and/or the address data (hereinafter, this address data is called test area data) of a memory cell block which is selected to be excluded from the test with the next test parameter value is transmitted to the main control part 21 from the area generation part (or a first area generation part) 34 of the area generation part 30 for generating an area to be tested. This main control part 21 specifies the address of a memory cell block address which is the object of the next test based on this test area data and the next test parameter value which is selected based on the inputted test program, generates one or more of test commands according to the next test parameter value and transmits to the MUT100. The MUT100 which receives this transmission performs the next test. This operation is repeated until the final test parameter value or all the memory test blocks have passed tests.

In order to specify an address of a memory cell block which is the object of a test, the address of a memory cell or a memory cell block which becomes the object of a test of the MUT100 is required. This address data is input together with a test program and stored in the data memory 22. Therefore, the data memory 22 has an MUT address data storage part 25 which internally stores this address data.

In addition, the results of a test at each test parameter value are correlated with the address data of the MUT100 which is stored in the MUT address data storage part 25 and stored in the main control part 21 as a test result of each memory cell block of the MUT100. The data, which is offered from the area generation part 34, included in the test area data, of a memory cell block which has passed a test using the previous test parameter value may be used as the address data of a memory cell block which should be excluded from a test using the next test parameter value. In this case, the main control part 21 refers to the address data of the MUT100 which is stored in the MUT address data storage part 25 and offered in advance by a test program, and stores the address of a memory cell block which has passed a test and/or failed a test for each test for each parameter value.

The data memory 22 stores a variety data which is used in a test. The data memory 22 is comprised of a test data storage part 23 which stores a test program which is input via the input part 10, a normal range data storage part 24 which stores normal range data which is decided at the time of manufacture and the MUT address data storage part 25 which stores the address data of the MUT.

The test data storage part 23 stores test program data which is decided in advance and which is input via the input part 10. This test program data is essentially related to a test parameter value and test sequence at the time of a test.

The normal range data storage part 24 is a storage part which stores data which shows a predetermined range which is decided in advance for removing deficiencies which occur in the manufacturing process. During a test, as a result, if the characteristics etc. of the MUT100 fall within the range of this normal range data, the MUT100 is judged as non-defective, alternatively, if the characteristics etc. of the MUT100 do not fall within the range of this normal range data, the MUT100 is judged as defective. This normal range data is included in a test program and is input via the input part 10 and stored in the normal range data storage part 24.

As stated above, the main control part 21 generates one or more of test commands each containing the address data of a memory cell block which becomes an object of a test using the next test parameter value based on a test program and test area data. A test is performed by these test commands and, in the case where all the tests using the test parameter values which are set in advance, are completed, in other words, in the case where there is no next test parameter value to be tested in the test data storage part 23, the main control part 21 compares the normal range data which is stored in the normal range data storage part 24, with the test results stored until that point within the main control part 21. Alternatively, in the case of all the results of the test commands show success of a test conducted by the test commands, the main control part 21 may compare the normal range data which is stored in the normal range data storage part 24, with the test results stored until that point within the main control part 21. If the test result falls within the predetermined normal range, the MUT100 is judged as non-defective and in the case where the result does not fall within the normal range, the MUT100 is judged as defective and this judgment result is output from the output part 40. Also, in the case where there is a display part, the judgment result is displayed in this display part.

The data address of the MUT100 specifies a memory cell block which passes a test (hereinafter called a pass memory cell block) and is required to store the data of a pass memory cell block. The pass memory cell block data is the data which distinguishes a memory cell block which passes a test at a certain parameter value. The MUT address data storage part 25 of the data memory 22 stores this address data which is input from the input part 10 together with a test program.

Further, in FIG. 1, although the test data storage part 23, the normal range data storage part 24 and the MUT address data storage part 25 are individually arranged, the role of each part is to store data and can be of a single construction.

The area generation part 20 for generating an area to be tested receives the transmission of a test result from the MUT100, stores data of a memory cell which has failed a test, generates data which specifies a memory cell which is to be tested at the next test parameter value and performs the role of transmitting to the main control part 21. This area generation part 30 for generating an area to be tested is comprised from a failure area data generation part (or second area generation part) 31, a pass/fail data memory change part 32, a pass/fail data memory 33 and an area generation part 34.

The failure area data generation part 31 receives the data of a test result transmitted from the MUT100, generates data (hereinafter called fail area data) of a memory cell block including a memory cell which has failed a test and forwards the data to the pass/fail data memory change part 32. The test result transmitted from the MUT100 is transmitted as address data of a memory cell which has completed a test. That is, for example, in the case where read-out is performed with a predetermined voltage in a characteristic verification, the address of a memory cell which could be read-out is output together read-out data. Therefore, the address data of the memory cells about which read-out data is not transmitted is also not transmitted. As a result, the memory cells whose address data is not transmitted are judged as failing a test. One aspect in one embodiment of the present invention is that fail area data is generated based on these memory cells which have failed a test.

Because a test result is stored in an address of a semiconductor testing device of one embodiment of the present invention corresponding to the address of a memory cell as stated above, in one embodiment of the present invention, the address data (including the data of a memory cell block) of the MUT100 input together with a test program, is stored in the failure area data generation part 31 via the main control part 21. As a result, the failure area data generation part 31 receives test data transmitted from the MUT100 and it becomes possible to generate fail area data based on address data of the MUT100. The failure area data generation part 31 transmits this generated fail area data to the pass/failure memory change part 32.

The pass/failure memory change part 32 receives the fail area data generated by the failure area data generation part 31 and controls the storing of this fail area data in the pass/fail memory 33. That is, the pass/fail data memory generation part 32 which takes/receives the fail area data from the failure area generation part 31 refers to the test result which is stored in the pass/fail data memory 33 and the test of which has been conducted in the value of a previous test parameter, extracts the difference between the fail area data of the current value of a test parameter and generates difference data. The pass/fail memory change part 32 transmits this difference data to the area generation part 34 together with the fail area data.

Here, because the difference data is the difference between the memory cell block which has passed a test of the current parameter value with the memory cell block which has failed a test of the previous parameter value, that is, it is the address data of a memory cell block which has passed the test with the current test parameter for the first time.

Following the completion of the extraction of the difference data, the pass/fail data memory change part 32, erases the fail area data created by the test of a previous test parameter value in the pass/fail data memory 33 and commands a change so that fail area data created by the test of a current test parameter value is stored. This change, for example, is realized by overwriting the fail area data. The pass/fail data memory 33 which receives a change command by overwriting in this way, erases the fail area data created by the test of a previous test parameter value stored within the fail area memory space (hereinafter called a FAM space) within this pass/fail data memory 33, and stores the fail area data created by a test of a current test parameter value. Therefore, the pass/fail data memory 33 stores only the fail area data created by one test with a certain test parameter value. By this, it is possible to save the memory space.

The pass/fail data memory 33 is a memory which stores a variety of data in a test. By controlling the pass/fail data memory change part 32, the fail area data as stated above, is stored in the internal FAM space.

The area generation part 34 generates data of a memory cell block which should be excluded from a test with the next test parameter value based on the fail area data which is stored in the above stated pass/fail data memory change part 32 or the difference data stated above. Because the MUT address data which is input together with the test program is stored in this area generation part 34, the difference data is generated as test exclusion area data. Thereupon, the fail area data which is transmitted from the pass/fail data memory change part 34, and this test exclusion area data are combined, test area data is generated and transmitted to the main control part 21.

Further, in FIG. 1, the pass/fail data memory change part 34 and the area generation part 34 are arranged separately, however, they may be integrated as one construction. That is, because both parts perform the same process such as generating data based in a memory cell block address which is input together with a test program from the input part 10, it is possible to combine them.

The output part 40 outputs externally a test result which is transmitted from the main control part 21 within the test control part 20. The main control part 21 compares the test result which is created by the tests with all the test parameter values, with the normal range data and judges whether it the results fall within the predetermined normal range. Then, this judgment result is output via the output part 40 and is used in the final judgment whether to ship.

The input part 10 may be constructed by a computer system about the scale of a work station, for example, and which transmits the test conditions which are shown by a test program etc, to the test control part 20 of the testing device main body 1 and carries out an initial setting. The test control part 20 tests the MUT100 in accordance with the test program initially set and outputs the test results from the output part 40. The settings, construction and operation of the test program are different according to the purpose of a test. For example, in the case of measuring the amount of electrons in a memory cell by a characteristic test, the step-up width etc from an initial value and the range of a test read-out voltage are set. Also, the normal range data for judging a deficient and non-deficient product is input at the same time as the test program and this normal range data is stored in the normal range data storage part 24 within the test control part 20. When a test is completed, the main control part 21 checks the normal range data stored in the normal range data storage part 24 and the results of a series of tests stored in the main control part 21, judges whether the MUT100 shows a characteristic within the normal range and gives a deficient or non-deficient product judgment.

In addition, the address data of the MUT is input together with the test program. This address data is used in the case where the fail area data generation part 31, the pass/fail data memory change part 32 and the area generation part each generate and store fail area data, difference data and test area data respectively via the input part 10.

The input part 10, as stated above, may be constructed by a computer system such as a work station and in FIG. 1, considering operability, is arranged independently from a test device main body 1, however, it is not limited to this, it may also be arranged within the test device main body 1.

The test head 50 electrically connects the MUT100 to the main body 1 of the semiconductor testing device relating to one embodiment of the present invention at the time of a test transmits a test command from the main body 1 to the MUT100.

Further, the semiconductor testing device relating to one embodiment of this invention generates a fail area data, as stated above, based on the address data of a memory block of an MUT which failed a test, however, in the case where test results of all the memory cells are stored as they are, the stored test results become extremely numerous as the test parameter values become wide ranging. For this, as one variation of a semiconductor test device relating to one embodiment of the present invention, a summary of test results for each memory cell block is stored.

That is, the address of a memory cell block of the MUT100 is specified by an a word line and a bit line of the MUT100, and a memory cell block is decided in such a way that a first memory cell block, for example, is decided by the word lines 0 to m and the bit lines 0 to n. As a result, a memory cell block which includes a memory cell can be specified by the address of the memory cell. Therefore, instead of storing the test results of all the memory cells, a memory cell block which includes a memory cell that has failed a test is stored as fail area in the fail area data generation part 31. In other words, a test result is stored for every block. Therefore, in the case where even one memory cell which is included in this memory cell block fails a test, this memory cell block becomes a fail area. Alternatively, if a certain memory cell block passes all the tests then that memory cell block is treated as a pass memory cell block (hereinafter a pass area). When a test result is stored for each memory cell, the amount of data which should be stored becomes vast. However, in this way, if a test result is stored for each memory cell block, it is possible to significantly reduce the amount of data comparing the memory space size required for storing every test result of every memory cell and the memory space size required for storing very test result of every memory block. That is, it is possible to shrink sizes of the test results and store them. Then, because this data is rewritten for each test parameter value as stated above, the amount of stored data is small.

The semiconductor testing device relating to one embodiment of this invention with a construction as that stated above, when a test result is going to be stored whose corresponding test consecutive to the previous test, erases the test result created by the test with a previous test parameter value and stores the result of a test created by test with a current test parameter value (that is, stores the test results by overwriting). As a result, a test result created by a test with a certain test parameter value and it is possible to store the address data in memory cell block units which include a memory cell which has failed a test. Further, in the case where the same testing process is performed while changing a test parameter value, the memory cell block which newly passes a test with a current test parameter value based on the stored previous test result, is excluded from being an object of subsequent tests. Therefore it is possible to shorten testing time. This exclusion process is explained below using the drawings.

Figure 2:
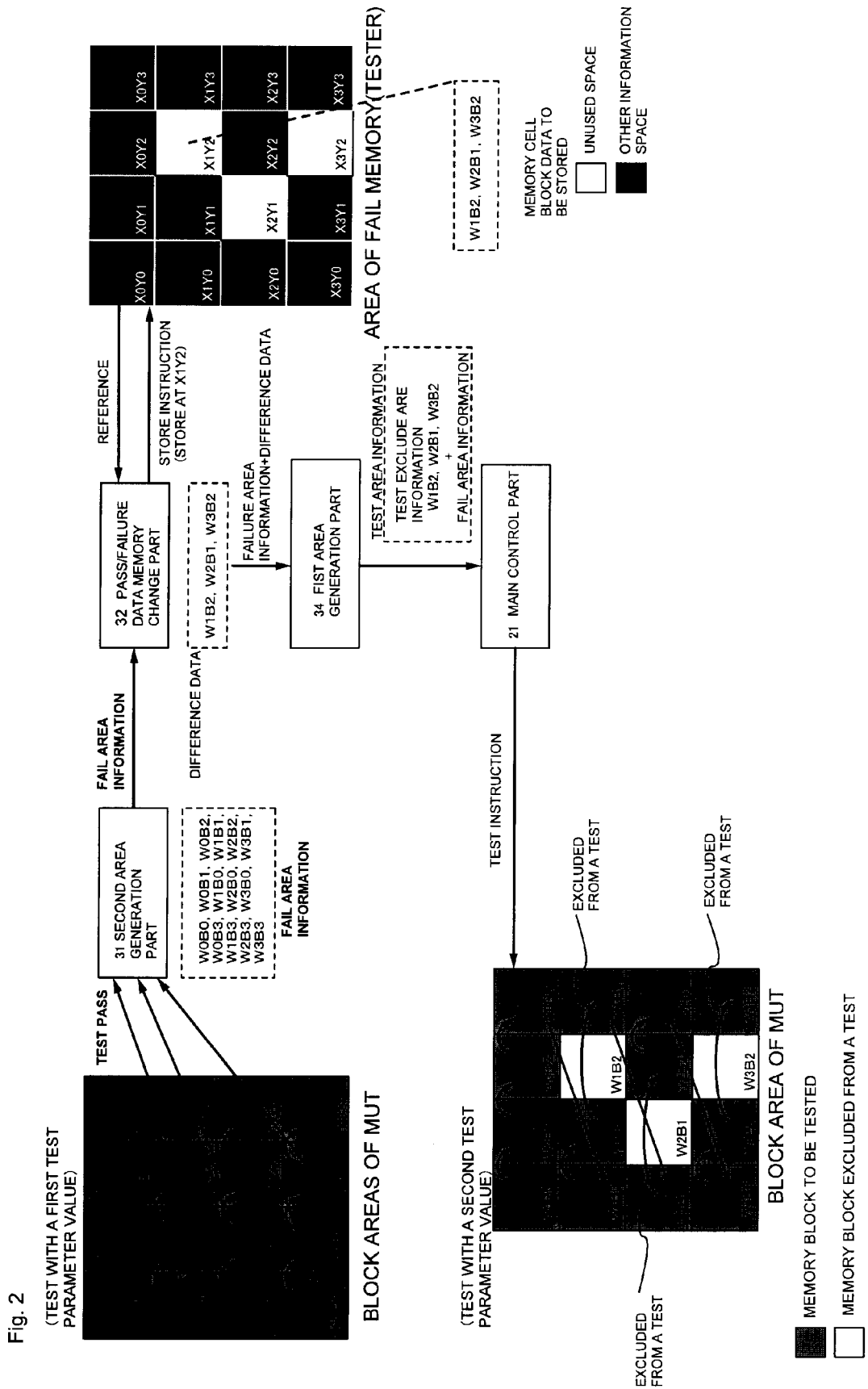
FIG. 2 shows a skipping operation of a memory block in a semiconductor testing device related to one embodiment of the present invention.

FIG. 2 is a typical drawing which shows the exclusion process of a memory cell block executed in a semiconductor testing device relating to one embodiment of the present invention. In order to simplify the explanation, the block construction of the MUT100 and the address of a FAM space of the semiconductor testing device relating to one embodiment of the present invention are each shown descriptively as a construction of four vertical rows and four horizontal rows. The address space of memory blocks of the MUT100 is represented as W0B0 to W3B3, the address space of the FAM space is represented as X0Y0 to X3Y3. In one embodiment of the present invention because an unused space of the FAM space is used (further, one part of the FAM space can also be used in the test device main body) the FAM space does not need to have an address space which is the same size as the address space constituted by memory cells of the MUT 100. Therefore, actually there are many cases where the number of left and right areas is different. In FIG. 2 an area construction of a memory cell block of the MUT100 is shown on the left side facing the FIG. 2 and the right side is a drawing which shows the FAM space of the pass/fail data memory 33 of the semiconductor testing device 1 as the address space XY.

The test program which is stored in the test data storage part 23 within the data memory 22 which is stored within the test control part 20 via the input part 10 in FIG. 1, generates test commands which instruct a test sequence for each parameter value and is transmitted via the main control part 21 to the MUT100. The drawing of the memory block in the left upper part of FIG. 2, shows the contents of this test command and a test sequence by a first test parameter before the start of a test.

According to these test commands, a test starts from the memory cell block W0B0 on the left side of the uppermost row and, in sequence, W0B1, W0B2, and W0B3 are tested. In the case where a test of the final memory block W0B3 of the uppermost row is completed, the test moves to the memory cell block W1B0 on the left side of the second row and, in the case where the test has finished up to the final memory cell block W1B3 on this row, the test shifts to the memory cell block on the left side of the third row and the test continues until the final memory cell block W3B3 by the same sequence. In FIG. 2 the test sequence is represented by the arrows.

A test regarding the MUT100 is performed by these test commands and the test results, as stated above, are transmitted to the fail area data generation part 31 of the test area generation part 30. The test results are generated as fail area data in the fail area data generation part 31 and transmitted to the pass/fail data memory change part 32. The pass/fail data memory change part 32 refers to the test results of one of the tests with a previous test parameter value which is stored in the pass/fail data memory 33, extracts the difference between the fail area data of the tests with a current test parameter value and generates difference data. This difference data is transmitted to the area generation part 34 from the pass/fail data memory change part 32. On the other hand, the pass/fail data memory change part 32 erases the fail area data of a test with a previous test parameter value in the pass/fail data memory 33 and gives a command so that the fail area data of a test with a current test parameter value is stored in the FAM space. In FIG. 2, an example is shown in which a command is given so that fail area data is stored at the address X1Y2 of the pass/fail data memory 33. If the pass/fail data memory 33 has fail area data from the test with a previous test parameter value, then a memory change is performed. For example, this fail area data is erased and the current fail area data is stored at the address X1Y2. In this case, it is overwritten. In addition, if there is no fail area data from the tests with a previous test parameter value (that is, in the case of tests with the first test parameter value) the fail area data is stored as it is (i.e., the fail area data represents the entire memory blocks of the MUT). The area generation part 34 generates difference data which is transmitted from the pass/fail data memory change part 32, as test exclusion area data. The memory block which is represented by this data is a memory cell block which has passed the previous test with a test parameter of the previous value, and even if a test with the next parameter value is not performed, the characteristics of this memory cell block can be ascertained. The drawing of the area of the pass/fail data memory of the semiconductor testing device in the upper right corner of FIG. 2 is a drawing which shown the circumstance in which fail area data is stored.

In the block area drawing in the upper left corner of FIG. 2, the memory cell blocks W1B2, W2B1 and W3B2 have passed a test of a first value test parameter. Therefore, fail area data which is created by this test with a current test parameter value is stored at the address X1Y2, which is one empty space of the FAM space in the upper right corner of FIG. 2 which has been specified by the semiconductor testing device relating to one embodiment of the present invention. The space in the FAM space which is covered in black is space in which other data is stored. The present invention uses the empty areas of the FAM space of the pass/fail data memory to store the test results.

The area generation part 34 generates the memory cell block data which is excluded from a test with the next test parameter value as test exclusion area data based on the difference data which is transmitted from the pass/fail data memory change part 32, combines this data with the fail area data which is transmitted from the pass/fail data memory change part 32 and transmits it as test area data to the main control part 21.

The main control part which receives this test area data selects a second test parameter value with which the next test is performed, generates one or more of test commands of the second value test parameter based on the test area data, and transmits these commands to the MUT100. The block area drawing in the bottom left corner of FIG. 2 shows the test sequence of these commands. The memory cell blocks W1B2, W2B1 and W3B2 which have passed a test with the previous first test parameter value are set so they are excluded from a test by this test command. That is, following the current test command, the test procedure goes on so that continuing to the memory cell block W1B1, memory cell block W1B2 is excluded, and the memory cell block W1B3 is set so that it is tested and the memory cell blocks W2B1 and W3B2 are set so they are similarly excluded from testing. Therefore, in the MUT100 which received this test command, these memory cell blocks W1B2, W2B1 and W3B2 are not tested and because these three memory cell blocks are excluded from a test with the second test parameter value, thirteen memory cell blocks are tested.

The tests are performed in the order of a test such that the next of the second test parameter is a third test parameter value, the next is a test with a fourth parameter value, and are repeated until a test with the final test parameter value is performed or all the memory cell blocks have passed the tests. When a test by the final test parameter value is performed or all the memory cell blocks have passed the test, a cross check is performed of the series of test data stored in the main control part 21 with the normal range data which is stored in the normal range data storage part 24 within the data memory 22 and the main control 21 judges whether the MUT100 is defective or non-defective.

Figure 3:
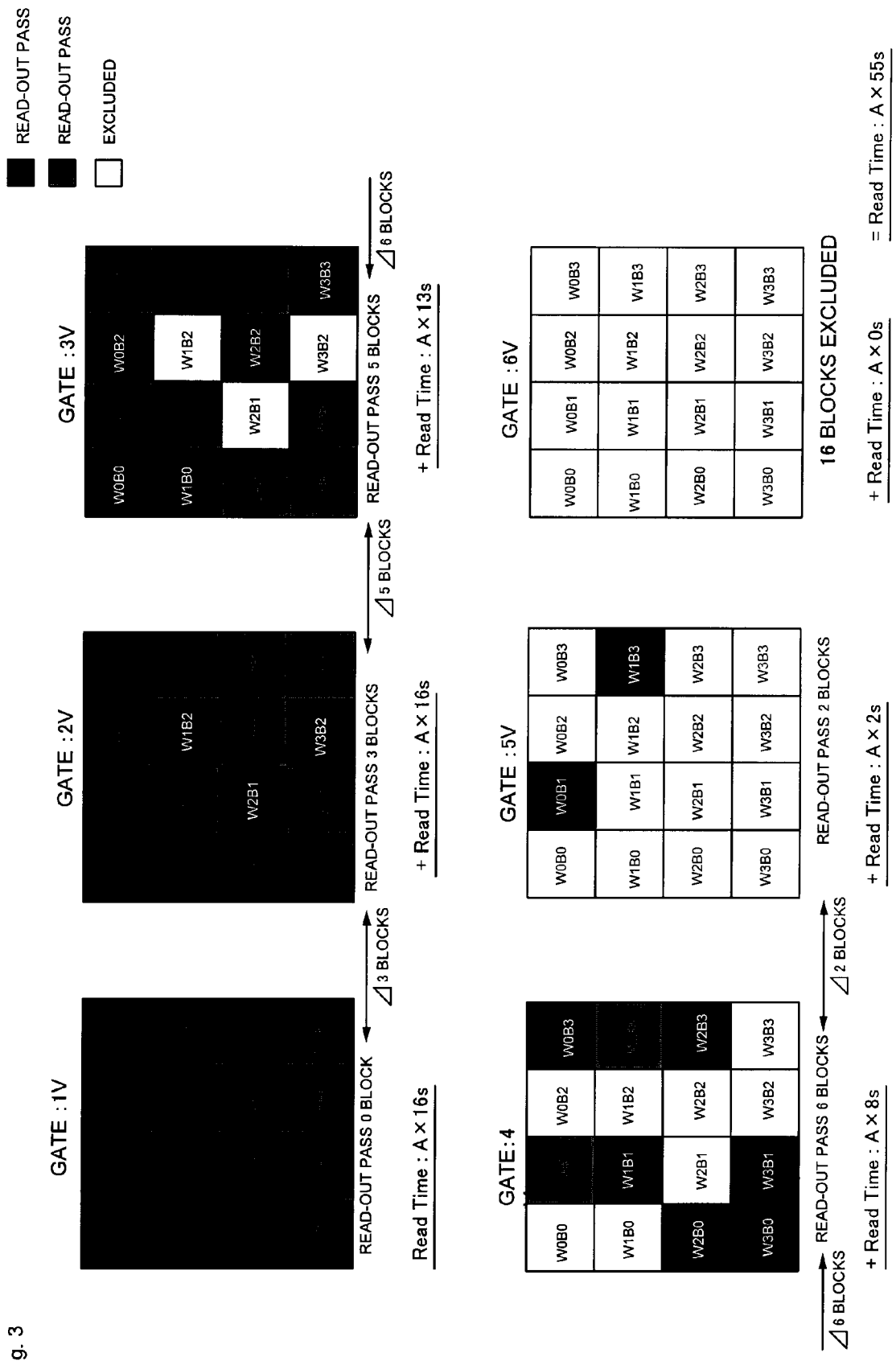
FIG. 3 explains a measurement test of the amount of electrons conducted by a semiconductor testing device related to one embodiment of the present invention.
Figure 4:
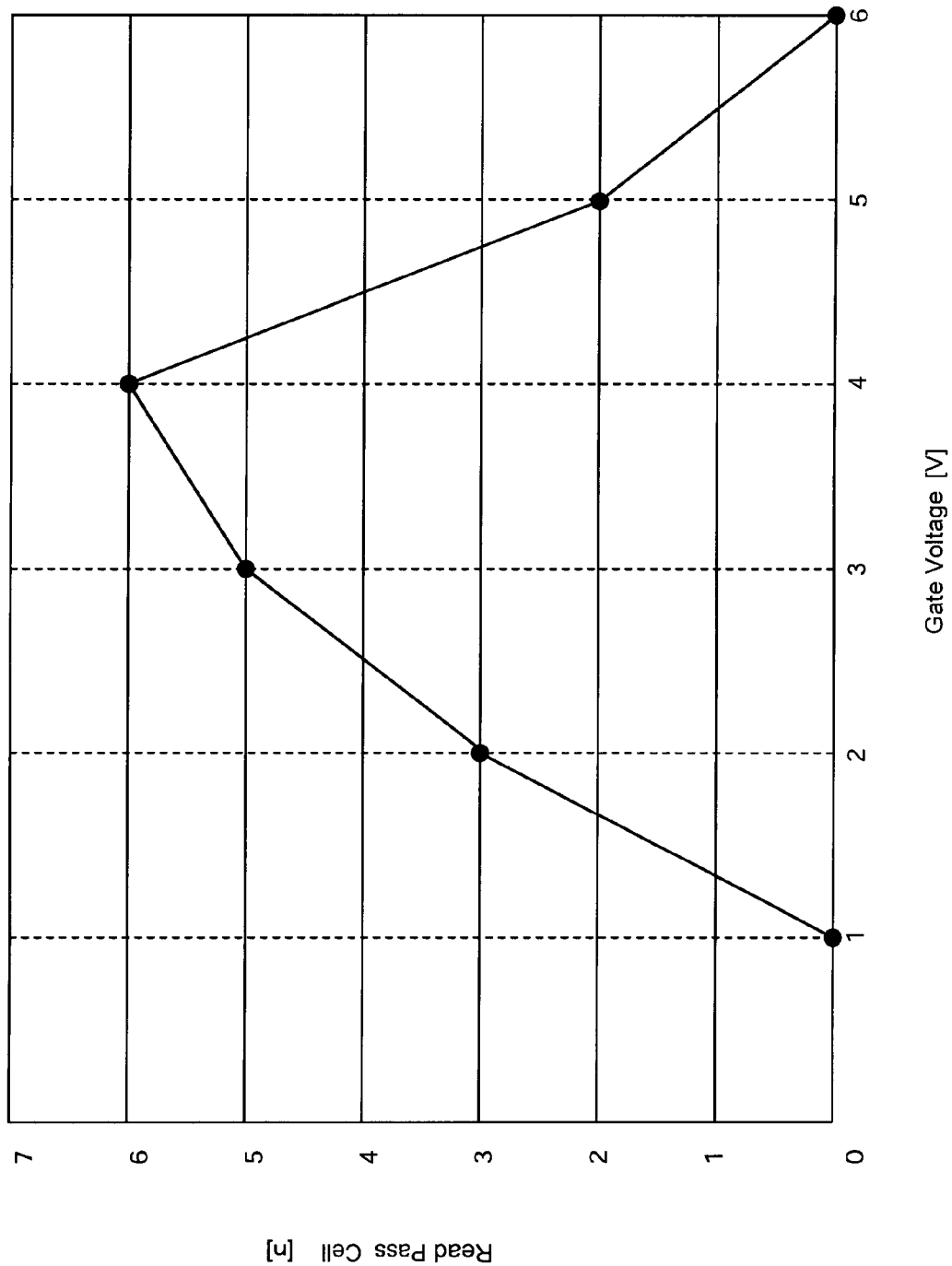
FIG. 4 shows a distribution of the result of a measurement test of the amount of electrons in a floating gate conducted by a semiconductor testing device related to one embodiment of the present invention shown in FIG. 3.

It is possible to shorten test time of the MUT 100 by the above stated operation. The effect of reducing test time by the semiconductor testing device 1 relating to one embodiment of this invention is explained while referring to the drawings. FIG. 3 is a drawing which shows the progress of the measurement of the amount of electrons in by the semiconductor testing device 1 relating to one embodiment of this invention. In FIG. 2, the placement of memory cells in the MUT100 is typically shown as a series of address spaces in memory cell block units of 4 vertical and 4 horizontal memory cell blocks. Also, for the purposes of explanation, the memory cell blocks are represented from W0B0 to W3B3. In addition, FIG. 4 shows an example of a distribution drawing of the measurement results of the amount of electrons in the floating gates in FIG. 3. The unit of measurement on the horizontal axis in FIG. 4 is a voltage which (V) which is applied to a control gate and the vertical axis shows the number of memory cell blocks which are judged to be "read-out pass" among the sixteen memory blocks.

The concept of the memory cell characteristic verification test by the semiconductor testing device 1 relating to one embodiment of the present invention in FIG. 3 is explained. This testing method is the same as the measurement of the amount of electrons in a floating gate of a memory cell in the MUT100 by the semiconductor testing device stated above. A predetermined voltage is applied to a control gate, data is programmed to all the memory cells in each memory cell block, and then read-out operations are repeated. A test using one test parameter value is performed from the memory cell block W0B0 until W3B3. The memory cells which could be read-out are judge as "read-out pass" and the memory cells which could not be read are judged as "read-out fail."

Here, the test results are transmitted from the MUT100 in FIG. 1 to the fail area data generation part 31 of the test area generation part 30. These test results are represented as data for each memory cell based on the address data of the MUT100. The address data of a memory cell of the MUT100 judged to be "read-out pass" and the address data of a memory cell of the MUT100 judges to be "read-out fail" are produced. The fail area data generation part 31 which has received the address data of a memory cell which has failed a read-out test processes the memory cell block which has this memory cell as a fail memory block (hereinafter called a fail area). This process is carried out even if only one memory cell within the memory cell block has failed a test. The fail area data generation part 31 performs this process based on the test results of all the memory cells, generates fail area data which is the data of the memory cell block which has failed a read-out test and transmits it to the pass/fail data memory 33.

This process is explained in FIG. 3 and FIG. 4. In FIG. 3 the memory cell blocks which have passed all the read-out tests (i.e., the memory cell blocks are in the "read-out pass" status) are represented in black and the memory cell blocks which have failed a read-out test (i.e., the memory cell blocks are in the "read-out fail" status) are represented in dark grey. The memory cell blocks which are to be excluded from a test (i.e., the memory cell blocks are in the "read-out excluded" status) with the next test parameter value, are represented in white. Also, the black dots on the coordinates in FIG. 4 are the number of the memory cell blocks which have passed a test at each read-out voltage.

In FIG. 3, the main control part 21 of FIG. 1 first applies a read-out voltage of 1V, which is the first test parameter value, and selects one or plurality of memory cell blocks which should be tested, generates test commands and transmits these to the MUT100 in accordance with the test program stored in the verification test storage part 23. In this case, because the tests use the first test parameter value there is no test area data in the area generation part 34 and therefore all the memory cell blocks are selected for testing.

The MUT100 in FIG. 1 performs tests based on these test commands from the main control part 21 and returns the test results to the fail area data generation part 31. When the test parameter value is 1V (the drawing on the left in the upper row of FIG. 3), all the memory cell blocks of the MUT100 are shown as "read-out fail."

The fail area data generation part 31 which receives the test results, generates fail area data as stated above based on the address data of the MUT100, which is input together with the test program, and transmits this to the pass/fail data memory change part 32. When the test parameter value is 1V (the drawing on the left in the upper row of FIG. 3), because the memory cell blocks W0B0 to W3B3 of the MUT100 are all "read-out fail," the fail area data generation part 31 generates fail area data to the effect that all the areas are in the "read-out fail" status.

The pass/fail data memory change part 32 cross checks this fail area data with the fail area data created by the tests with the previous test parameter value which is stored in the pass/fail data memory 33, generates difference data and transmits it to the area generation part 34. When the test parameter is 1V (the drawing on the left in the upper row of FIG. 3), all the areas are stored to the effect that they are in the "read-out fail" status at 1V. Also, because there is no immediately previous storage history, the difference data becomes the data of all the function areas.

The area generation part 34 generates test area data which should be tested next based on this difference data and transmits it to the main control part 21. When the test parameter value is 1V (the drawing on the left in the upper row of FIG. 3), all the memory cell blocks of the MUT100 from W0B0 to W3B3 become included in the test area data.

The main control part 21 which has received this test area data internally stores all the memory cell blocks W0B0 to W3B3 as memory cell blocks in the "read-out fail" status when the test parameter value is 1V. This storage state is represented as 0 "read-out pass" memory cells at a read-out voltage of 1V in FIG. 4. The main control part 21 refers to the verification test storage part 23 and based on the test area data generates a read-out voltage of 2V which is the next test parameter and a test command which consists of the memory cell blocks which should be tested and transmits this to the MUT100. In the test where the test parameter value is 1V, because all the memory cell blocks are in the "read-out fail" status, the number of memory cell blocks which are excluded from the next tests is 0. Therefore, in the tests where the test parameter value is 2V, all the memory cell blocks are included in the test command.

The MUT100 which has received these test commands transmits the test results to the fail area data generation part 31. In FIG. 3, the three memory cell blocks W1B2, W2B1 and W3B2 pass the test when the test parameter value is 2V (the drawing in the middle of the upper row in FIG. 3). Therefore, the fail area data generation part 31 generates fail area data of the memory cell blocks excluding the three memory cell blocks and transmits this to the pass/fail data memory change part 32.

The pass/fail data memory change part 32 performs a control so that this fail area data is stored in the unused memory areas of the pass/fail data memory 33. At this time, the fail area data which is created by the test with the previous test parameter value is controlled so that it is overwritten and stored. Also, referring to this previous fail area data, difference data is generated and transmitted to the area generation part 34. When the test parameter value is 2V (the drawing in the middle of the upper row in FIG. 3), the addresses W1B2, W2B1 and W3B2 of the MUT100 are stored as "read-out pass" at 2V. Also, referring to this previous fail area data, difference data is generated, however, this difference data becomes the area data of the thirteen memory cell blocks excluding the addresses W1B2, W2B1 and W3B2 of the MUT100.

The area generation part 34 generates test area data which should be tested next based on the difference data and transmits this to the main control part 21. When the test parameter value is 2V (the drawing in the middle of the upper row in FIG. 3), the fail area data of the thirteen memory cell blocks excluding the addresses W1B2, W2B1 and W3B2 of the MUT100 and the test area data which consists of the test exclusion area data of the addresses W1B2, W2B1 and W3B2 of the MUT100 are generated.

The main control part which has received this test area data internally stores the thirteen memory blocks excluding the addresses W1B2, W2B1 and W3B2 of the MUT100 as "read-out fail" when the test parameter value is 2V. This storage state is represented as three "read-out pass" memory cell blocks at a read-out voltage of 2V in FIG. 4. Also, the main control part 21 generates a read-out voltage of 3V which is the next test parameter value and a test command which consists of data of the memory block which should be tested and transmits this to the MUT100. In a test where the test parameter value is 2V, thirteen memory cell blocks failed the test. As a result, three memory cell blocks are excluded from the next test. Therefore, the thirteen memory cell blocks which should be tested by a test using a test parameter value of 3V are specified in the next test commands.

Furthermore, while changing the order of the test parameter value, the tests are continued by the same procedure, however, in a test where the test parameter value is 3V, the test result is renewed and the five memory cell block addresses W0B0, W0B2, W2B1, W2B2 and W3B5 of the MUT100 are judged to be "read-out pass," and because the three memory cell blocks W1B2, W2B1 and W3B2 are already excluded from a test, the five memory cell blocks which are judged to be "read-out pass" are represented in black and the three memory cell blocks excluded from the test with the next test parameter value are shown in white (the drawing in on the right of the upper row in FIG. 3).

Continuing from the test which has test parameter value of 3V, tests are similarly performed with the test parameter value of 4V and the test commands which exclude from the tests the memory cell blocks which have already passed the previous tests, are produced. Specifically, the test commands are produced so that the eight memory cell blocks W0B0, W0B2, W1B0, W1B2, W2B1, W2B2, W3B2 and W3B3 are excluded from a test. Therefore, the test commands are produced for the remaining eight memory cells blocks and the test result is renewed and six memory cell blocks pass the test. Specifically, in the test where the test parameter value is 4V, the test result is renewed with the addresses W0B3, W1B1, W2B0, W2B3, W3B0 and W3B1 of the MUT100 pass the test. As a result the addresses of the memory cell blocks W0B1 and W1B3 of the MUT100 fail the test. In FIG. 3, the six memory cell blocks which pass a test are represented in black and the two memory cell blocks which fail are represented in dark grey. The remaining eight memory cell blocks which are set so that they are already excluded from the next test are represented in white (the drawing on the left of the lower row in FIG. 3).

Continuing from the test which has test parameter value of 4V, a test is performed with a test parameter value of 5V. In this case, in addition to the eight memory cell blocks which are set so that they are excluded from a test with a test parameter value of 4V, because the six memory cell blocks which newly passed the test with the test parameter of 4V are set so that they are excluded from the next test the number of memory cell blocks which are excluded from the test becomes fourteen. As a result, only the memory cell blocks W0B1 and W1B3 are tested with the test with the next test parameter value. The result of the test where the test parameter value is 5V is that because these two memory cell blocks newly pass the test, these "read-out pass" memory cell blocks are represented in black (the drawing in the centre if the lower row in FIG. 3).

Continuing similarly, according to the test program which is input, a further test where the test parameter value is 6V is performed. Because all the memory cell blocks have already passed the series of test up to the test where the test parameter was 5V, all the memory cell blocks are excluded from this further test and the test is thus not performed (the drawing on the right of the lower row in FIG. 3).

The test results of the tests from the test parameter value of 3V to 6V are represented as five "read-out pass" memory cell blocks at 3V, six "read-out pass" memory cell blocks at 4V, two "read-out pass" memory cell blocks at 3V and zero "read-out pass" memory cell blocks at 6V.

The time related to the test processing above is explained based on FIG. 3. In the test with a test parameter value which is 1V at the start of the test, because there are no memory cell blocks which are excluded from the test, all the memory cell blocks are tested. In the case where the programming and read-out of one memory cell block is represented in (A) seconds, the Read Time is (A×16) seconds because the same operation is repeated for all sixteen memory cell blocks (the drawing on the left in the upper row in FIG. 3).

Because the number of memory cell blocks which are (read-out pass) in the test where the test parameter value is 1V is 0, there are no memory cell blocks which are excluded from the test where the test parameter value is 2V. Therefore, because all the memory cell blocks are tested, the Read Time is (A×16) (the drawing in the center in the upper row in FIG. 3).

Because the number of memory cell blocks which are (read-out pass) in the test where the test parameter value is 2V is three, and because three memory cell blocks are excluded from the test where the test parameter value is 3V, the test is performed on (16−3)=(13) memory cell blocks. Therefore, the Read Time is (A×13) (the drawing on the right in the upper row in FIG. 3).

Because the number of memory cell blocks which are "read-out pass" in the test where the test parameter value is 3V is five, the number of memory cell blocks which are excluded from the test when the test parameter value is 4V is (3+5)=(8) and the test is performed on (16−8)=(8) memory cell blocks. Therefore, the Read Time is (A×8) (the drawing on the left in the lower row in FIG. 3).

Because the number of memory cell blocks which are (read-out pass) in the test where the test parameter value is 4V is six, the number of memory cell blocks which are excluded from the test when the test parameter value is 5V is (3+5+6)=(14) and the test is performed on (16−14)=(2) memory cell blocks. Therefore, the Read Time is (A×2) (the drawing in the center in the lower row in FIG. 3).

Because the number of memory cell blocks which are (read-out pass) in the test where the test parameter value is 5V is two, the number of memory cell blocks which are excluded from the test when the test parameter value is 6V is (3+5+6+2)=(16). In other words, all the memory cell blocks are excluded from the test and the test is not performed. Therefore, the Read Time is (A×0) (the drawing on the right in the lower row in FIG. 3).

As a result of the above, the amount of time required for a series of tests in the semiconductor testing device relating to one embodiment of the present invention, is Read Time=(A×16+A×16+A×13+A×8+A×2+A×0) sec=(A×55) seconds. When compared with Read Time=(A×96) seconds of the tests by the conventional semiconductor testing device shown in FIG. 5, a reduction in time can be realized by using embodiment one of the present invention.

In an actual test, because the test parameter value is set in 0.1V step up to 10V from 0V as stated above, the effects of one embodiment of the present invention are considerably large and can contribute to a reduction in the test time.

In a test where the same operation is repeated while changing the test parameter value, because the memory cell blocks which pass a test in the middle of the tests are excluded from further tests, the more the number of the test parameter value increases the more noticeable the effects of the semiconductor testing device relating to one embodiment of the present invention. Also, because the operation which is repeated increases the more the memory cells which are tested increase, the superiority of the semiconductor testing device 1 relating to one embodiment of the present invention, stands out.

As stated above, in the semiconductor testing device 1 relating to one embodiment of the present invention, each memory cell is stored as passing or failing a test with predetermined test parameter value using the unused area of the FAM space of the pass/fail data memory 33 within the semiconductor testing device 1. At this time, the data which is stored has only address data of a memory cell block which has failed a test. Also, because the data which is stored is rewritten and stored for each test parameter value, the amount of data which is stored can be few. Further, because the memory cell blocks which pass a test at a certain test parameter value in a series of tests are excluded from tests with further test parameter values, it is possible to reduce testing time. In the semiconductor testing device relating to one embodiment of the present invention, there is no need to arrange a new memory for storing a test result within the testing device, therefore, after each change of the MUT100 which is tested, there is no need to change the memory which is arranged within the testing device, the tests can be performed more efficiently and a reduction in test time becomes possible.

It is possible to manage a variety of different tests in the semiconductor testing device relating to one embodiment of the present invention, by changing the test program which is input. Next, the reduction in verification test time of a memory cell access time will be explained using the semiconductor testing device 1 relating to a second embodiment of the present invention.

The access time verification, is a verification as to whether the device can be shipped as a product or not by measuring the amount of time required for read-out of a memory cell with application of a voltage corresponding to "0" data and "1" data to a memory cell at a predetermined threshold potential, and determining whether the distribution within a predetermined range is shown across the entire MUT100.

Because the construction of the semiconductor testing device 1 relating to a second embodiment of the present invention is the same as the construction of the semiconductor testing device 1 relating to embodiment one of the present invention, its explanation is omitted. In the present invention also, in a test which repeats a predetermined testing processes with changing the test parameter value which is given to the MUT100, the memory cell blocks which pass a test at a certain test parameter value are excluded from tests of further test parameter values and testing time is reduced. In this exclusion, the memory cell blocks which include the memory cells which have failed a test at a test parameter value up to the previous test parameter value are stored as fail area data using the empty areas of the FAM space of the pass/fail data memory and based on the difference data between the fail area data created by the test with the previous test parameter value which is stored and the fail area data created by the test with the current test parameter value, the progressive exclusion from the test with the next test parameter value is controlled. This control is the same as the control in embodiment one of the present invention.

The access test determines whether it is possible to read-out at a predetermined read-out voltage within a predetermined amount of time each memory cell of the MUT100 which are programmed at a predetermined threshold voltage. Specifically, following programming at a predetermined threshold voltage, the amount of time required for read-out is set, for example, in intervals of 10 ns as a test parameter value from 10 ns to 100 ns and read-out is performed. Generally, if all the memory cells can be accessed within a range of 20 ns to 80 ns, the test is passed, and in the case where a number of memory cells can not be read-out within 100 ns, the test is failed. For example, even if 100 ns has elapsed, if the memory cell can not be read-out the test is failed.

First, programming is performed to all the memory cells of the MUT100 at a predetermined threshold voltage. The test begins by transmitting one or plurality of test commands which are generated in the main control part 21 in FIG. 1 to the MUT100. One or plurality of test commands are generated for each memory cell, every command of one or plurality of test commands uses its test parameter of 10 ns which is the first test parameter value prepared in the main control part 21 and transmitted to the MUT100 for all the memory cell blocks based on the test program which is stored in the verification data storage part 23, the test area data from the area generation part 34 and the address data of the MUT address data storage part 25.

In the MUT100, a predetermined read-out voltage for the time length of 10 ns is applied to all the memory cells and a test is performed to determine if each memory cell can be read-out. The test result is transmitted to the fail area data generation part 31 of the area generation part for 30 for areas to be tested.

The fail area data generation part 31 receives this test result and based on the address data of a memory cell which has failed a test with a first test parameter value of 10 ns and the MUT address data, generates address data of the memory cell blocks which include the memory cells which have failed this test, as fail area data and transmits the data to the pass/fail data memory change part 32.

The pass/fail data memory change part 32 which receives the fail area data refers to the fail area data created by the test with the previous test parameter value which is stored in the FAM space of the pass/fail data memory 33, cross checks with the fail area data created by the current test result and generates difference data. This difference data is the data of a memory cell block which has passed for the first time a test with the current test parameter value. Because there is no fail area data by a test with the previous test parameter value which is stored in the FAM space, in the test with a first test parameter value of 10 ns, the difference data is generated as it is. This generated difference data is then transmitted to the area generation part 34 from the pass/fail data memory change part 32.

The area generation part 34 generates the test areas which should tested next based on this difference data and transmits this to the main control part 21.

The main control part 21 generates a test command which consists of the second test parameter value which is 20 ns and the address data of the memory cell blocks which are to be tested, based on this test area data transmitted from the area generation part 34 and the test program which is stored in the verification data storage part 23 of the data memory 22, and transmits the test command to the MUT100.

In the MUT100, a predetermined read-out voltage for the time length of 20 ns is applied to all the memory cells and a test is performed to determine if the memory cells can be read-out. The test result is transmitted to the fail area data generation part 31 of the area generation part for 30 for areas to be tested.

The fail area data generation part 31 receives this test result and based on the address data of a memory cell which has failed a test with a second test parameter value of 20 ns and the MUT address data, generates address data of the memory cell blocks which include the memory cells which have failed this test, as fail area data and transmits the data to the pass/fail data memory change part 32.

The pass/fail data memory change part 32 which receives the fail area data refers to the fail area data created by the test with the test which has a first test parameter value of 10 ns which is stored in the FAM space of the pass/fail data memory 33, cross checks with the fail area data created by the current test result and generates difference data. This difference data is the data of a memory cell block which has passed for the first time a test with the current test parameter value of 20 ns. This generated difference data is then transmitted to the area generation part 34 from the pass/fail data memory change part 32.

The area generation part 34 generates the test areas which should tested next based on this difference data and transmits this to the main control part 21.

The process stated above is repeated until the test with a final test parameter value of 100 ns which is set by the test program stored in the verification data storage part 23. When the test with a final test parameter value of 100 ns is completed, that is, it is determined that there is no subsequent test parameter value by referring to the test program stored in the verification data storage part 23, the main control part 21 compares the normal range data which is stored in the normal range data storage part 24 with the test result up to that point which is stored within the main control part 21. If the test result falls within the predetermined normal range, the MUT100 is judged as non-defective and in the case where the result does not fall within the normal range, the MUT100 is judged as defective and this judgment result is output from the output part 40. Also, in the case where there is a display part, the judgment result is displayed in this display part.

In the above stated access test also, it is possible to achieve a reduction in testing time by the semiconductor testing device relating to embodiment one of the present invention. Furthermore, in the semiconductor testing device relating to embodiment one of the present invention, it is also possible to obtain the same effects in the case of testing as a test parameter value the command timing of erasure and programming.

These effects are produced by a method where the semiconductor testing device relating to embodiment one of the present invention progressively excludes memory blocks which have passed a test with a certain test parameter in a series of consecutive tests. Therefore, the more the number of test parameter values increases in a series of consecutive tests, the more noticeable are the effects.

What is claimed is:

1. A semiconductor testing device comprising:
   a data memory which stores a test program, said test program to be used for generating one or more of test commands, each of said one or more of test commands instructing a test of a plurality of functions, said plurality of functions being included in one function area of a plurality of function areas of a semiconductor device;
   a first area generation part which generates first data, said first data identifying one or more of function areas of said plurality of function areas;
   a main control part which generates said one or more of test commands based on said test program and said first data and transmits said one or more of test commands to said semiconductor device;
   a second area generation part which receives a first result, said first result being returned from said semiconductor device based on one or more of first tests, each of said one or more of first tests having been instructed by each of said one or more of test commands, said second area generation part generating one or more of second results based on said first result, each of said one or more of second results showing a pass or failure of each of said one or more of first tests; and
   a third area generation part which transmits said one or more of second results to said first area generation part, said first area generation part generating second data based on said second result, said second data identifying one or more of said plurality of function areas, a plurality of functions of each of said one or more of said plurality of function areas being the object of second tests subsequent to said first tests.

2. The semiconductor testing device according to claim 1, further comprising:
   a pass/failure data memory which correlates each of said one or more of second results with identification information of each of said plurality of function areas and stores them, and;
   a pass/failure data memory change part which performs a change of second results stored in said pass/failure data memory based on said one or more of second results generated by said second area generation part,
   wherein said first area generation part refers to said change of second results to generate said second data.

3. The semiconductor testing device according to claim 2, wherein said pass/failure data memory change part changes a part of said second results stored in said pass/failure data memory, each second result of said parts being correlated with identification information of a function area which has passed one of said first tests.

4. The semiconductor testing device according to claim 2, wherein said change performed by said pass/failure data memory change part is realized by overwriting said second results stored in said pass/failure data memory.

5. The semiconductor testing device according to claim 4, wherein said overwriting of said second results is performed on a part of said second results stored in said pass/failure data memory, each second result of said parts being correlated with identification information of a function area which has passed one of said first tests.

6. The semiconductor testing device according to claim 1, wherein said test command includes a parameter value determined by said test program, said parameter value being determined in an order wherein a second test of a function area succeeds if a first test precedent in said order to said second test of said function area succeeds.

7. The semiconductor testing device according to claim 1, wherein said first area generation part generates said second data by eliminating data identifying a function area which has passed one of said first tests from said first data.

8. The semiconductor testing device according to claim 1, wherein said semiconductor device is a memory device arranged with a plurality of memory cell blocks, each of said plurality of memory cell blocks having a plurality of memory cells.

9. The semiconductor testing device according to claim 8, wherein each of said plurality of function areas corresponds to each of said plurality of memory cell blocks and each of said plurality of functions corresponds to each of said plurality of memory cells.

10. The semiconductor testing device according to claim 8, wherein said test command is a command which performs a test in each of said plurality of memory cells and if said first result shows the existence of a memory cell which has not passed said first test among said plurality of memory cells, said second result shows that a memory cell block which includes that memory cell has not passed said first test.

11. The semiconductor testing device according to claim 8, wherein said test command is a command which performs a read-out test of each of said plurality of memory cells and if read-out is not performed within a predetermined time period said first result shows that a test has not been passed.

12. The semiconductor testing device according to claim 8, wherein each of said plurality of memory cells has a floating gate which can accumulate electric charge and said test command instructs a measurement of the amount of electric charge accumulated in said floating gate after a predetermined voltage has been applied to said floating gate.

13. A method for testing a semiconductor device comprising:
    storing a test program, said test program to be used for generating one or more of test commands, each of said one or more of test commands instructing a test of a plurality of functions, said plurality of functions being included in one function area of a plurality of function areas of a semiconductor device;
    generating first data, said first data identifying one or more of function areas of said plurality of function areas;
    generating said one or more of test commands based on said test program and said first data and transmits said one or more of test commands to said semiconductor device;
    receiving a first result, said first result being returned from said semiconductor device based on one or more of first tests, each of said one or more of first tests having been instructed by each of said one or more of test commands;
    generating one or more of second results based on said first result, each of said one or more of second results showing a pass or failure of each of said one or more of first tests; and
    generating second data based on said second result, said second data identifying one or more of said plurality of function areas, a plurality of functions of each of said one or more of said plurality of function areas being the object of second tests subsequent to said first tests.

14. A method for testing a semiconductor device according to claim 13, wherein said second data is generated by eliminating data identifying a function area which has passed one of said first tests from said first data.

15. The method for testing a semiconductor device according to claim 14, wherein testing said semiconductor device terminates if all data of said first data is eliminated.

16. A method for testing a semiconductor device comprising according to claim 13, wherein said test command includes a parameter value determined by said test program, said parameter value being determined in an order wherein a second test of a function area succeeds if a first test precedent in said order to said second test of said function area succeeds.

17. A method for testing a semiconductor device according to claim 13, wherein said semiconductor device is arranged with a plurality of memory cell blocks which have a plurality of memory cells and each of said plurality of function area corresponds to each of said plurality of memory cell blocks and each of said plurality of functions corresponds to each of said memory cell.

18. A computer program product having a set of executable instruction codes stored on a computer readable medium, said set of instruction codes is executable by a computer for controlling a semiconductor testing device, comprising:
    storing a test program, said test program to be used for generating one or more of test commands, each of said one or more of test commands instructing a test of a plurality of functions, said plurality of functions being included in one function area of a plurality of function areas of a semiconductor device;
    generating first data, said first data identifying one or more of function areas of said plurality of function areas;
    generating said one or more of test commands based on said test program and said first data and transmits said one or more of test commands to said semiconductor device;
    receiving a first result, said first result being returned from said semiconductor device based on one or more of first tests, each of said one or more of first tests having been instructed by each of said one or more of test commands;
    generating one or more of second results based on said first result, each of said one or more of second results showing a pass or failure of each of said one or more of first tests; and
    generating second data based on said second result, said second data identifying one or more of said plurality of function areas, a plurality of functions of each of said one or more of said plurality of function areas being the object of second tests subsequent to said first tests.

19. The media which can be read by a computer according to claim 18, wherein said second data is generated by eliminating data identifying a function area which has passed one of said first tests from said first data and testing said semiconductor device terminates if all data of said first data is eliminated.

20. The media which can be read by a computer according to claim 18, wherein said semiconductor device is arranged with a plurality of memory cell blocks which have a plurality of memory cells and each of said plurality of function area corresponds to each of said plurality of memory cell blocks and each of said plurality of functions corresponds to each of said memory cell.

* * * * *